(12) United States Patent
Cai

(10) Patent No.: US 11,719,989 B2
(45) Date of Patent: Aug. 8, 2023

(54) DISPLAY PANEL AND ELECTRICAL APPARATUS WITH LIGHT TRANSMITTANCE ADJUSTMENT LAYER

(71) Applicant: Shenzhen China Star Optoelectronics Semiconductor Display Technology Co., Ltd., Guangdong (CN)

(72) Inventor: Zhenfei Cai, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 760 days.

(21) Appl. No.: 16/620,874

(22) PCT Filed: Dec. 3, 2019

(86) PCT No.: PCT/CN2019/122528
§ 371 (c)(1),
(2) Date: Dec. 10, 2019

(87) PCT Pub. No.: WO2020/228301
PCT Pub. Date: Nov. 19, 2020

(65) Prior Publication Data
US 2020/0363691 A1 Nov. 19, 2020

(30) Foreign Application Priority Data
May 16, 2019 (CN) .......................... 201910410158.9

(51) Int. Cl.
*G02F 1/157* (2006.01)
*G02F 1/153* (2006.01)
(Continued)

(52) U.S. Cl.
CPC ............ *G02F 1/157* (2013.01); *G02F 1/1533* (2013.01); *H10K 59/124* (2023.02); *H10K 59/50* (2023.02)

(58) Field of Classification Search
CPC ... G02F 1/157; G02F 1/1533; H01L 27/3232; H01L 27/3258
(Continued)

(56) References Cited

U.S. PATENT DOCUMENTS 9,640,594 B2 5/2017 Oh et al.
2011/0163664 A1* 7/2011 Kang .................. H01L 27/3244
345/82
(Continued)

FOREIGN PATENT DOCUMENTS

CN 107452779 A 12/2017
CN 107644895 A 1/2018
(Continued)

*Primary Examiner* — Xia L Cross
(74) *Attorney, Agent, or Firm* — Mark M. Friedman

(57) ABSTRACT

The present invention provides a display panel and an electrical apparatus. The display panel includes: at least one displaying region, the displaying region including a plurality of pixel points; at least one light transmission region, the light transmission region disposed alternately with the displaying region, and the light transmission region including light transmission thin films laminated. The light transmission region further includes a light transmittance adjustment layer located between any adjacent two of the light transmission thin films.

11 Claims, 4 Drawing Sheets

(51) Int. Cl.
*H10K 59/50* (2023.01)
*H10K 59/124* (2023.01)

(58) Field of Classification Search
USPC .......................................................... 359/275
See application file for complete search history.

(56) References Cited

U.S. PATENT DOCUMENTS

| | | | |
|---|---|---|---|
| 2015/0379925 A1* | 12/2015 | Jung | ................. H01L 27/326 |
| | | | 345/83 |
| 2016/0104752 A1 | 4/2016 | Oh et al. | |
| 2017/0219900 A1* | 8/2017 | Kim | ................. G02F 1/157 |
| 2019/0214440 A1* | 7/2019 | Lee | ................. H01L 27/3246 |
| 2019/0349550 A1* | 11/2019 | Bang | ................. H04N 7/144 |
| 2020/0105842 A1 | 4/2020 | Qi et al. | |

FOREIGN PATENT DOCUMENTS

| | | |
|---|---|---|
| CN | 108987451 A | 12/2018 |
| CN | 109326222 A | 2/2019 |
| CN | 110164928 A | 8/2019 |

\* cited by examiner

DISPLAY PANEL AND ELECTRICAL APPARATUS WITH LIGHT TRANSMITTANCE ADJUSTMENT LAYER

FIELD OF INVENTION

The present invention relates to a field of electrical displays, especially to a display panel and an electrical apparatus.

BACKGROUND OF INVENTION

A transparent display screen can perform light transmittance and display, in other words, it can display images while not blocking articles behind the display screen, and therefore can have extensive application prospects in aspects of commercial displays.

SUMMARY OF INVENTION

Technical Issue

In a condition of light with high brightness, background brightness of a display increases to cause low contrast of a light displaying region and light of a light transmission region, which results a poor display effect. Especially, when a dark image of low gray scale is illustrated in the displaying region, the contrast lowers and causes graphics on the display screen cannot be identified by a user, which affects the display effect.

Therefore, it is necessary to optimize the conventional technologies.

Technical Solution

The present invention provides a display panel and an electrical apparatus to improve contrast of a displaying region and a non-displaying region of a transparent display in an environment of high brightness.

To solve the above issue, the present invention provides a display panel, and the display panel comprises:

at least one displaying region, each of the at least one displaying region comprising a plurality of pixel points; and at least one light transmission region, wherein each of the at least one light transmission region is disposed adjacent to one of the at least one displaying region, and the light transmission region comprises light transmission thin films laminated;

wherein each of the at least one light transmission region further comprising a light transmittance adjustment layer disposed between any adjacent two of the light transmission thin films.

In one aspect of the present invention, the light transmittance adjustment layer comprises:

an electrochromic material, wherein a light transmittance of the electrochromic material relates to voltages of two ends of the electrochromic material; and a first adjustment electrode and a second adjustment electrode, wherein the first adjustment electrode and the second adjustment electrode are located respectively on two opposite surfaces of the electrochromic material, and are configured to adjust the voltages of the ends of the electrochromic material.

In one aspect of the present invention, the electrochromic material comprises organic electrochromic material and inorganic electrochromic material;

the organic electrochromic material comprises one of tungsten trioxide, molybdenum oxide, and iridium oxide, and a combination thereof; and the inorganic electrochromic material comprises one of polythiophene and its derivative, viologen compound, tetrathiafulvalene compound, and metal phthalocyanine compound, and a combination thereof.

In one aspect of the present invention, the display panel further comprises a brightness inspection unit, and the brightness inspection unit is configured to inspect brightness of an environment in which the display panel is placed; and when the brightness of the environment inspected is higher than threshold brightness, an electrical signal configured to lower brightness of the light transmittance adjustment layer is transmitted.

In one aspect of the present invention, the threshold brightness is greater than or equal to 60% of current displayed brightness of the display panel.

In one aspect of the present invention, the display panel comprises a plurality of displaying regions and a plurality of light transmission regions, and the displaying regions and the light transmission regions are disposed alternately.

In one aspect of the present invention, the displaying region comprises:

a substrate;

a thin film transistor layer, the thin film transistor layer located on the substrate;

a light emitting layer, the light emitting layer located on the thin film transistor layer; and a color filter layer, the color filter layer located on the light emitting layer; and wherein the thin film transistor layer comprises transparent insulation layers laminated, the light transmission thin films of the light transmission region comprise extension portions of the transparent insulation layers extending toward an outside of the thin film transistor layer.

In one aspect of the present invention, the light transmittance adjustment layer is located between any adjacent two of the extension portions of the transparent insulation layers toward the outside of the thin film transistor layer.

In one aspect of the present invention, the light emitting layer comprises a pixel definition layer made of transparent insulation material, and the light transmittance adjustment layer is located in the pixel definition layer.

In one aspect of the present invention, the light transmittance adjustment layer is located on the light emitting layer, and is disposed alternately with the color filter layer.

Correspondingly, the present invention also provides an electrical apparatus, the electrical apparatus comprises a display panel, and the display panel comprises:

at least one displaying region, each of the at least one displaying region comprising a plurality of pixel points; and at least one light transmission region, wherein each of the at least one light transmission region is disposed adjacent to one of the at least one displaying region, and the light transmission region comprises light transmission thin films laminated;

wherein each of the at least one light transmission region further comprising a light transmittance adjustment layer disposed between any adjacent two of the light transmission thin films.

In one aspect of the present invention, the electrical apparatus comprises a transparent showcase.

In one aspect of the present invention, the light transmittance adjustment layer comprises:

an electrochromic material, wherein a light transmittance of the electrochromic material relates to voltages of two ends of the electrochromic material; and a first adjustment electrode and a second adjustment electrode, wherein the first adjustment electrode and the second adjustment electrode are located respectively on two opposite surfaces of the electrochromic material, and are configured to adjust the voltages of the ends of the electrochromic material.

In one aspect of the present invention, the electrochromic material comprises organic electrochromic material and inorganic electrochromic material;

the organic electrochromic material comprises one of tungsten trioxide, molybdenum oxide, and iridium oxide, and a combination thereof; and the inorganic electrochromic material comprises one of polythiophene and its derivative, viologen compound, tetrathiafulvalene compound, and metal phthalocyanine compound, and a combination thereof.

In one aspect of the present invention, the display panel further comprises a brightness inspection unit, the brightness inspection unit is configured to inspect brightness of an environment in which the display panel is placed; and when the brightness of the environment inspected is higher than threshold brightness, an electrical signal configured to lower brightness of the light transmittance adjustment layer is transmitted.

In one aspect of the present invention, the threshold brightness is greater than or equal to 60% of current displayed brightness of the display panel.

In one aspect of the present invention, the display panel comprises a plurality of displaying regions and a plurality of light transmission regions, and the displaying regions and the light transmission regions are disposed alternately;

the displaying region comprises:

a substrate;

a thin film transistor layer, the thin film transistor layer located on the substrate;

a light emitting layer, the light emitting layer located on the thin film transistor layer; and a color filter layer, the color filter layer located on the light emitting layer;

the thin film transistor layer comprises transparent insulation layers laminated, the light transmission thin films of the light transmission region comprise extension portions of the transparent insulation layers extending toward an outside of the thin film transistor layer.

In one aspect of the present invention, the light transmittance adjustment layer is located between any adjacent two of the extension portions of the transparent insulation layers toward the outside of the thin film transistor layer.

In one aspect of the present invention, the light emitting layer comprises a pixel definition layer made of transparent insulation material, and the light transmittance adjustment layer is located in the pixel definition layer.

In one aspect of the present invention, the light transmittance adjustment layer is located on the light emitting layer, and is disposed alternately with the color filter layer.

Advantages

The present invention disposes the light transmittance adjustment layer in the light transmission region of the transparent display panel. When brightness of the light transmittance adjustment layer exceeds threshold brightness of an external environment, the light transmittance of the light transmission region is lowered to decrease the brightness of the light transmission region, which enhances contrast of the displaying region and the non-displaying region. The present invention can prevent lowered contrast of the display panel in the environment of high brightness, which enhances display effect of the display panel in the environment of high brightness.

DETAILED DESCRIPTION OF PREFERRED EMBODIMENTS

Figure 1:
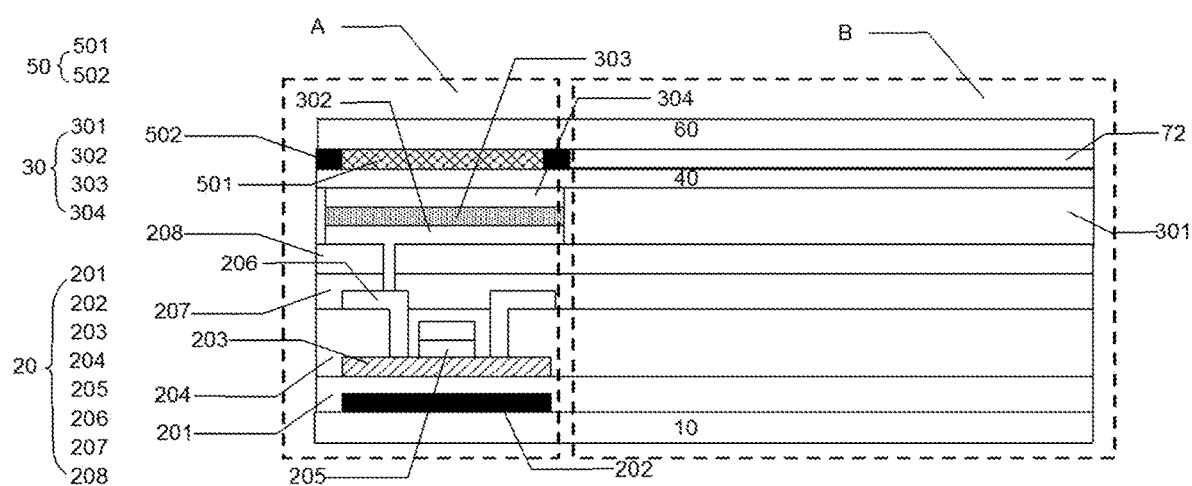
FIG. 1 is a schematic structural view of a display panel of a first specific embodiment of the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

The present invention will be described in details with accompanying drawings as follows.

The present invention provides a display panel to improve contrast of a displaying region and the non-displaying region of transparent display in an environment of high brightness.

With reference to FIG. 1, FIG. 1 is a schematic structural view of a display panel of a first specific embodiment of the present invention. The display panel comprises: at least one displaying region A and at least one light transmission region B. In the present embodiment, the display panel comprises a plurality of displaying regions A and a plurality of light transmission regions B, the displaying regions A and the light transmission regions B are disposed alternately. Each of the displaying regions A comprises a plurality of pixel points, and each of the light transmission regions B are disposed adjacent one of the displaying regions A. Each of the light transmission regions B comprises light transmission thin films laminated. FIG. 1 exemplarily illustrates a structure of one of the pixel points in the displaying region A. Actually, each of the displaying region A can comprise a plurality of pixel points disposed adjacently. FIG. 1 is only used for explaining the present invention, and cannot be understood as a limitation to the present invention.

With reference to FIG. 1, the displaying region A comprises:

a substrate 10;

a thin film transistor layer 20, the thin film transistor layer 20 located on the substrate 10;

a light emitting layer 30, the light emitting layer 30 located on the thin film transistor layer 20;

a color filter layer 50, the color filter layer 50 located on the light emitting layer.

The thin film transistor layer 20 comprises transparent insulation layers laminated, the light transmission thin films of the light transmission region B comprise extension portions of the transparent insulation layers extending toward an outside of the thin film transistor layer.

In the present embodiment, the thin film transistor layer 20 comprises: a light shielding metal layer 202, a buffer layer 201, an active region 203, a gate electrode lamination layer 205, an interlayer dielectric layer 204, a source and drain metal layer 206, a first planarization layer 207, and a second planarization layer 208. The buffer layer 201, the interlayer dielectric layer 204, the first planarization layer 207, and the second planarization layer 208 are transparent insulation layers.

The light shielding metal layer 202 is located on the substrate 10. The buffer layer 201 covers the light shielding metal layer. The active region 203 is located on the buffer layer 201. The active region 203 comprises a channel region and a source region and a drain region that are located respectively two sides of the channel region. The gate electrode lamination layer 205 comprises a gate insulation layer and a gate metal layer. The gate electrode lamination layer 205 covers the channel region. The interlayer dielectric layer 204 covers the active region 203 and the gate electrode lamination layer 205. The interlayer dielectric layer 204 comprises a through hole exposing the source region and the drain region. The source and drain metal layer 206 is located on the interlayer dielectric layer 204, and is electrically connected to the source region and the drain region by the through hole. The first planarization layer 207 and second planarization layer 208 are located on the interlayer dielectric layer 204 and has a through hole exposing the source and drain metal layer 206.

In the present embodiment, the light emitting layer 30 comprises: a pixel definition layer 301, an anode 302, a light emitting material layer 303, and a cathode 304.

The anode 302 is located on the second planarization layer 208, and is electrically connected to the source and drain metal layer 206 of the thin film transistor layer 20 by the through hole. The pixel definition layer is located on the second planarization layer 208, and has an opening exposing the anode 302. The light emitting material layer 303 is located in the opening, and covers the anode 302. The cathode 304 covers the light emitting material layer 303.

The display panel in the present application further comprises an encapsulation layer 40 covering the light emitting layer 30. In the present embodiment, the encapsulation layer 40 is a thin film encapsulation structure.

The color filter layer 50 comprises a color filter 501 and a black light shielding block 502 configured to isolate the color filter 501. A height of the color filter 501 is equal to a height of the black light shielding block 502. Alternatively, the height of the black light shielding block 502 is greater than the height of the color filter 501.

The display panel in the present invention further comprises a cover plate 60 covering the color filter layer 50. The cover plate is preferably a glass cover plate. In the present embodiment, the cover plate 60 is further integrated with a touch unit.

In the present invention, the light transmission region B comprises light transmission thin films laminated. In the present embodiment, with reference to FIG. 1, the light transmission thin films in the light transmission region B are constructed by the extension portions of the transparent insulation layers in the displaying region A, and specifically comprise a buffer layer 201, an interlayer dielectric layer 204, a first planarization layer 207, and a second planarization layer 208.

In the present invention, the light transmission region B further comprises a light transmittance adjustment layer 72 disposed between any adjacent two of the light transmission thin films.

Figure 2:
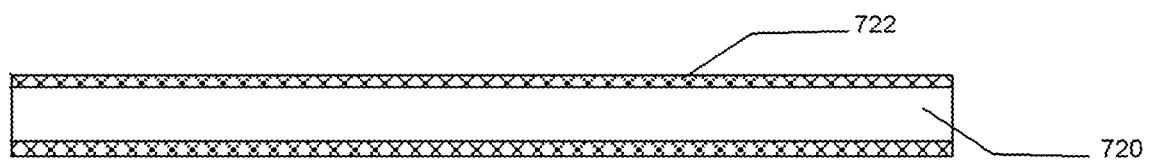
FIG. 2 is a schematic enlarged view of a light transmittance adjustment layer in FIG. 1.

With reference to FIG. 2, FIG. 2 is a schematic enlarged view of a light transmittance adjustment layer in FIG. 1. The light transmittance adjustment layer 72 comprises an electrochromic material 720 and an adjusting electrode 722. A light transmittance of the electrochromic material 720 relates to voltages of two ends of the electrochromic material 720. The adjusting electrode 722 comprises a first adjustment electrode and a second adjustment electrode. The first adjustment electrode and the second adjustment electrode are located respectively on two opposite surfaces of the electrochromic material 720, and are configured to adjust the voltages of the ends of the electrochromic material 720. The first adjustment electrode and the second adjustment electrode are transparent electrodes.

The electrochromic material comprises organic electrochromic material and inorganic electrochromic material. The organic electrochromic material comprises one of tungsten trioxide, molybdenum oxide, iridium oxide, and a combination thereof. The inorganic electrochromic material comprises one of polythiophene and its derivative, viologen compound, tetrathiafulvalene compound, and metal phthalocyanine compound, and a combination thereof. The above materials are bidirectionally reversible dual color electroluminescent materials. When no voltage is applied, the electrochromic material is transparent. When a voltage changing the color is applied, the electrochromic material changes its color, and then after the applied voltage is removed, the material restores to be transparent.

In the present embodiment, the display panel further comprises a brightness inspection unit, the brightness inspection unit is configured to inspect brightness of an environment in which the display panel is placed. When the brightness of the environment inspected is higher than threshold brightness, an electrical signal configured to lower brightness of the light transmittance adjustment layer 72 is transmitted.

When the electrical signal for lowering brightness emitted from the brightness inspection unit is received, two ends of the first adjustment electrode and two ends of the second adjustment electrode of the light transmittance adjustment layer 72 are applied with a stable voltage, the direct current voltage is a voltage that can change the electrochromic material 720 from a transparent status to a non-transparent status.

The threshold brightness is greater than or equal to 60% of current displayed brightness of the display panel. Of course, according to different demands of display, the threshold brightness can be adjusted. For example, to acquire better display effect, the threshold brightness can be set as 50% or lower to further enhance brightness difference between the displaying region and the non-displaying region.

In the present invention, the light transmittance adjustment layer 72 is located between any adjacent two of the extension portions of transparent insulation layers toward the outside of the thin film transistor layer. A number of the light transmittance adjustment layer can also be set as required, the number of the light transmittance adjustment layer is greater, an adjustment range is greater, and the display effect is accordingly better.

Figure 3:
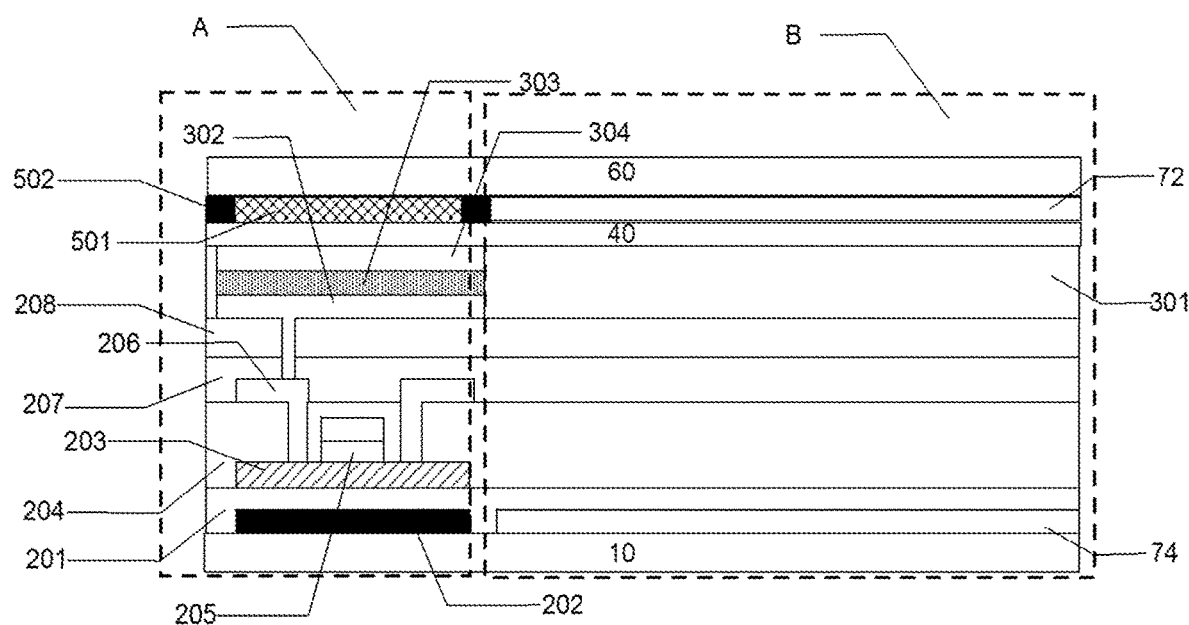
FIG. 3 is a schematic structural view of a display panel of a second specific embodiment of the present invention.

With reference to FIG. 3, in a second embodiment of the present invention, the display panel comprises a light transmittance adjustment layer 72 and an auxiliary light modulating layer 74. The light transmittance adjustment layer 72 is located on the light emitting layer, and is disposed at an interval from the color filter layer. The auxiliary light modulating layer 74 is located in the buffer layer 201.

Figure 4:
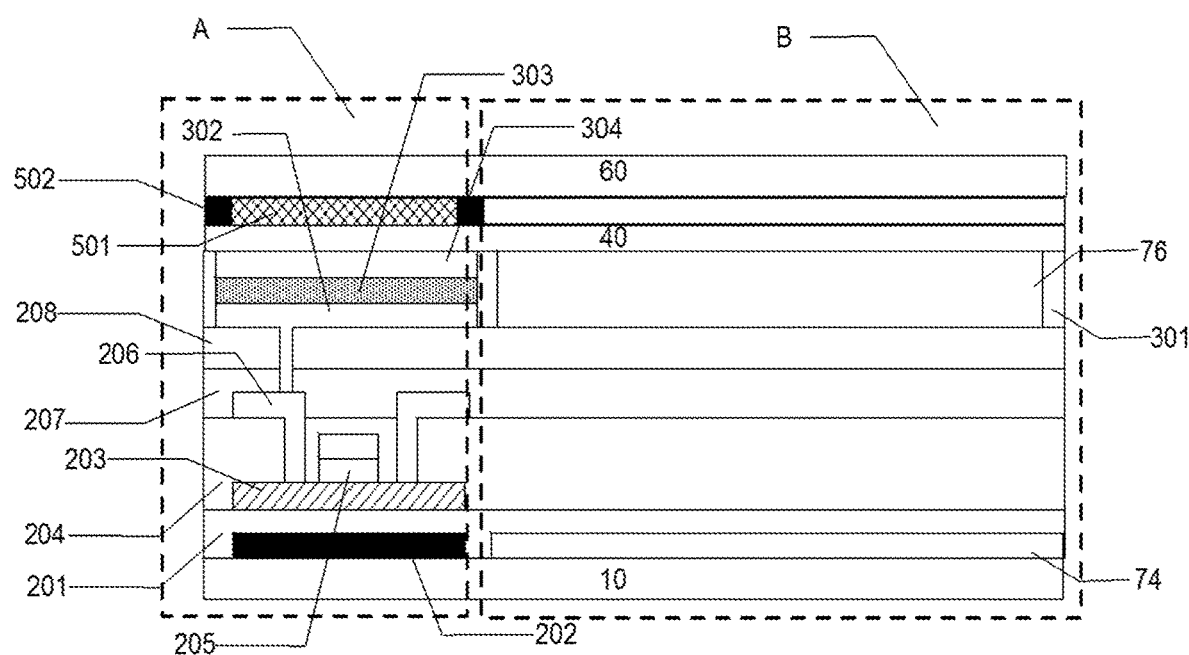
FIG. 4 is a schematic structural view of a display panel of a third specific embodiment of the present invention.

With reference to FIG. 4, in a third embodiment of the present invention, the display panel comprises a second light transmittance adjustment layer 76 and an auxiliary light modulating layer 74. The second light transmittance adjustment layer 76 is located in the pixel definition layer. The auxiliary light modulating layer 74 is located in the buffer layer 201.

The embodiments of the present invention only symbolically enumerating the location and number of possible settings of the light transmittance adjustment layer. Actually, both the location and number of the light transmittance adjustment layer can be set as required. The above embodiments are only for explanation of the present invention and cannot be understood as a limitation to the present invention.

Accordingly, the present invention also provides an electrical apparatus, the electrical apparatus comprises the above display panel. The electrical apparatus can be a transparent showcase.

The present invention disposes the light transmittance adjustment layer in the light transmission region of the transparent display panel. When brightness of the light transmittance adjustment layer exceeds threshold brightness of an external environment, the light transmittance of the light transmission region is lowered to decrease the brightness of the light transmission region, which enhances contrast of the displaying region and the non-displaying region. The present invention can prevent lowered contrast of the display panel in the environment of high brightness, which enhances display effect of the display panel in the environment of high brightness.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A display panel, wherein the display panel comprises:
   a plurality of displaying regions, each of the plurality of displaying regions comprising a plurality of pixel points; and
   a plurality of light transmission regions, wherein each of the plurality of light transmission regions is disposed adjacent to one of the plurality of displaying regions, and comprises light transmission thin films laminated;
   wherein each of the plurality of light transmission regions further comprises a light transmittance adjustment layer disposed between any adjacent two of the plurality of light transmission thin films;
   wherein the plurality of displaying regions and the plurality of light transmission regions are disposed alternately;
   wherein each of the plurality of displaying regions comprises: a substrate; a thin film transistor layer, the thin film transistor layer located on the substrate; a light emitting layer, the light emitting layer located on the thin film transistor layer; and a color filter layer, the color filter layer located on the light emitting layer;
   wherein the thin film transistor layer comprises transparent insulation layers laminated, the light transmission thin films comprise extension portions of the transparent insulation layers extending toward an outside of the thin film transistor layer;
   wherein the light transmittance adjustment layer is located on the light emitting layer, and is disposed alternately with the color filter layer;
   wherein a bottom surface of the color filter layer is coplanar with a bottom surface of the light transmittance adjustment layer;
   wherein the light transmission thin films comprise a buffer layer, an interlayer dielectric layer, a first planarization layer, and a second planarization layer; and
   wherein an auxiliary light modulating layer is located in the buffer layer and overlaps with the light transmittance adjustment layer in a plan view, a side wall of the auxiliary light modulating layer is coplanar with a sidewall of the light transmittance adjustment layer.

2. The display panel as claimed in claim 1, wherein the light transmittance adjustment layer comprises:
   an electrochromic material, wherein a light transmittance of the electrochromic material relates to voltages of two ends of the electrochromic material; and
   a first adjustment electrode and a second adjustment electrode, wherein the first adjustment electrode and the second adjustment electrode are located respectively on two opposite surfaces of the electrochromic material, and are configured to adjust the voltages of the ends of the electrochromic material.

3. The display panel as claimed in claim 2, wherein
   the electrochromic material comprises organic electrochromic material and inorganic electrochromic material;
   the inorganic electrochromic material comprises one of tungsten trioxide, molybdenum oxide, and iridium oxide, and a combination thereof; and
   the organic electrochromic material comprises one of polythiophene and its derivative, viologen compound, tetrathiafulvalene compound, and metal phthalocyanine compound, and a combination thereof.

4. The display panel as claimed in claim 1, wherein
   the display panel further comprises a brightness inspection unit, and the brightness inspection unit is configured to inspect brightness of an environment in which the display panel is placed; and
   when the brightness of the environment inspected is higher than threshold brightness, an electrical signal configured to lower brightness of the light transmittance adjustment layer is transmitted.

5. The display panel as claimed in claim 4, wherein the threshold brightness is greater than or equal to 60% of current displayed brightness of the display panel.

6. An electrical apparatus, wherein the electrical apparatus comprises a display panel, and the display panel comprises:
   a plurality of displaying regions, each of the plurality of displaying regions comprising a plurality of pixel points; and
   a plurality of light transmission regions, wherein each of the plurality of light transmission regions is disposed adjacent to one of the plurality of displaying regions, and comprises light transmission thin films laminated;
   wherein each of the plurality of light transmission regions further comprises a light transmittance adjustment layer disposed between any adjacent two of the plurality of light transmission thin films;

wherein the plurality of displaying regions and the plurality of light transmission regions are disposed alternately;

wherein each of the plurality of displaying regions comprises: a substrate; a thin film transistor layer, the thin film transistor layer located on the substrate; a light emitting layer, the light emitting layer located on the thin film transistor layer; and a color filter layer, the color filter layer located on the light emitting layer;

wherein the thin film transistor layer comprises transparent insulation layers laminated, the light transmission thin films comprise extension portions of the transparent insulation layers extending toward an outside of the thin film transistor layer;

wherein the light transmittance adjustment layer is located on the light emitting layer, and is disposed alternately with the color filter layer;

wherein a bottom surface of the color filter layer is coplanar with a bottom surface of the light transmittance adjustment layer;

wherein the light transmission thin films comprise a buffer layer, an interlayer dielectric layer, a first planarization layer, and a second planarization layer; and wherein an auxiliary light modulating layer is located in the buffer layer and overlaps with the light transmittance adjustment layer in a plan view, a side wall of the auxiliary light modulating layer is coplanar with a sidewall of the light transmittance adjustment layer.

7. The electrical apparatus as claimed in claim 6, wherein the electrical apparatus comprises a transparent showcase.

8. The electrical apparatus as claimed in claim 7, wherein the display panel further comprises a brightness inspection unit, the brightness inspection unit is configured to inspect brightness of an environment in which the display panel is placed; and when the brightness of the environment inspected is higher than threshold brightness, an electrical signal configured to lower brightness of the light transmittance adjustment layer is transmitted.

9. The electrical apparatus as claimed in claim 8, wherein the threshold brightness is greater than or equal to 60% of current displayed brightness of the display panel.

10. The electrical apparatus as claimed in claim 6, wherein the light transmittance adjustment layer comprises:

an electrochromic material, wherein a light transmittance of the electrochromic material relates to voltages of two ends of the electrochromic material; and a first adjustment electrode and a second adjustment electrode, wherein the first adjustment electrode and the second adjustment electrode are located respectively on two opposite surfaces of the electrochromic material, and are configured to adjust the voltages of the ends of the electrochromic material.

11. The electrical apparatus as claimed in claim 10, wherein the electrochromic material comprises organic electrochromic material and inorganic electrochromic material;

the inorganic electrochromic material comprises one of tungsten trioxide, molybdenum oxide, and iridium oxide, and a combination thereof; and the organic electrochromic material comprises one of polythiophene and its derivative, viologen compound, tetrathiafulvalene compound, and metal phthalocyanine compound, and a combination thereof.

\* \* \* \* \*